(12) United States Patent
Kim et al.

(10) Patent No.: US 12,224,270 B2
(45) Date of Patent: Feb. 11, 2025

(54) TILED DISPLAY DEVICE

(71) Applicant: SAMSUNG DISPLAY CO., LTD., Yongin-si (KR)

(72) Inventors: Hyun-Hyang Kim, Suwon-si (KR); Dahye Kim, Seoul (KR); Mansoo Kim, Hwaseong-si (KR); Jeongweon Seo, Hwaseong-si (KR); Juyoun Son, Cheonan-si (KR); Jae Sul An, Hwaseong-si (KR); Min-Gwan Hyun, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 392 days.

(21) Appl. No.: 17/652,797

(22) Filed: Feb. 28, 2022

(65) Prior Publication Data

US 2022/0328463 A1  Oct. 13, 2022

(30) Foreign Application Priority Data

Apr. 9, 2021 (KR) ........................ 10-2021-0046384

(51) Int. Cl.
*H10K 59/12* (2023.01)
*H01L 25/10* (2006.01)
*H10K 50/86* (2023.01)

(52) U.S. Cl.
CPC ......... *H01L 25/105* (2013.01); *H10K 50/865* (2023.02); *H10K 59/12* (2023.02)

(58) Field of Classification Search
CPC .......................... H10K 50/865; H10K 59/12
USPC .......................................................... 258/91
See application file for complete search history.

(56) References Cited

U.S. PATENT DOCUMENTS

| | | | | |
|---|---|---|---|---|
| 10,868,102 | B1* | 12/2020 | Zhang | H01L 23/562 |
| 2020/0211929 | A1* | 7/2020 | Son | G09F 9/3026 |
| 2021/0202630 | A1* | 7/2021 | Jeon | H10K 59/122 |

FOREIGN PATENT DOCUMENTS

| | | | | |
|---|---|---|---|---|
| KR | 10-2039838 | | 11/2019 | |
| WO | WO-2021035403 A1 * | | 3/2021 | H01L 27/3262 |

* cited by examiner

*Primary Examiner* — Phuc T Dang
(74) *Attorney, Agent, or Firm* — F. CHAU & ASSOCIATES, LLC

(57) ABSTRACT

A tiled display device includes a plurality of display panel modules arranged adjacent to each other. Each of the plurality of display panel modules includes a display panel including a display area and a bezel area at least partially surrounding the display area, a light blocking layer disposed on the display panel and extending from the display area to a portion of the bezel area, and a protective layer disposed on the light blocking layer. In the bezel area, a distance from an end of the display panel to an end of the protective layer is greater than a distance from the end of the display panel to an end of the light blocking layer. Accordingly, an air layer is not formed between the protective layer and the display panel. A visibility of a seam area is reduced.

11 Claims, 5 Drawing Sheets

TILED DISPLAY DEVICE

CROSS-REFERENCE TO RELATED APPLICATION(S)

This application claims priority under 35 USC § 119 to and the benefit of Korean Patent Application No. 10-2021-0046384, filed on Apr. 9, 2021, the disclosure of which is hereby incorporated by reference in its entirety.

TECHNICAL FIELD

The present disclosure relates to a display device. More specifically, the present disclosure relates to a tiled display device.

DISCUSSION OF THE RELATED ART

As display devices are increasingly utilized in a variety of different manners, a demand for a large-area display device is increasing. However, manufacturing a large-area display device using only a single display panel may be difficult and expensive.

A method of realizing a large-area display device by combining a plurality of display panels without increasing an area of the display device has been proposed. Such display devices are often referred to as "tiled" as the multiple display panels are arranged as tiles.

Accordingly, a tiled display device may have a structure in which each of a plurality of display panels are connected to each other in order to realize a large-area screen. Each of the display panels may include a display area displaying an image and a bezel area surrounding the display area.

SUMMARY

A tiled display device includes a plurality of display panel modules that are arranged adjacent to each other. Each of the plurality of display panel modules includes a display panel including a display area and a bezel area at least partially surrounding the display area, a light blocking layer disposed on the display panel and extending from the display area to a portion of the bezel area, and a protective layer disposed on the light blocking layer. In the bezel area, a distance from an end of the display panel to an end of the protective layer may be greater than a distance from the end of the display panel to an end of the light blocking layer.

The protective layer may include an anti-glare film or an anti-reflective film.

A color of the light blocking layer may be black.

Each of the plurality of display panel modules may further include a first ink covering both an exposed upper surface of the display panel and a side surface of the display panel within the bezel area.

Each of the plurality of display panel modules may further include a second ink covering a side surface of the protective layer within the bezel area.

The first ink may contact the second ink within the bezel area. The first ink may further cover an upper surface of the light blocking layer and a side surface of the light blocking layer.

A color of the first ink may be the same as a color of the second ink.

A color of the first ink and a color of the second ink may be black.

A tiled display device includes a plurality of display panel modules arranged adjacent to each other and a resin. Each of the plurality of display panel modules includes a display panel including a display area and a bezel area at least partially surrounding the display area, a light blocking layer disposed on the display panel and extending from the display area to a portion of the bezel area, and a protective layer disposed on the light blocking layer. The resin contacts the display panel within the bezel area.

The resin may contact the protective layer.

Each of the plurality of display panel modules may further include an ink covering a side surface of the display panel.

A color of the ink may be black.

The ink may further cover a portion of a rear surface of the display panel within the bezel area.

The ink may cover the rear surface of the display panel from an end of the display panel to an end of the light blocking layer.

A refractive index of the resin may be equal to a refractive index of the protective layer.

A tiled display device includes a plurality of display panel modules arranged adjacent to each other. Each of the plurality of display panel modules includes a display panel including a display area and a bezel area at least partially surrounding the display area, a light blocking layer disposed on the display panel and extending from the display area to a portion of the bezel area, and a protective layer disposed on the light blocking layer. In the bezel area, a distance from an end of the display panel to an end of the protective layer may be equal to a distance from the end of the display panel to an end of the light blocking layer.

Each of the plurality of display panel modules may further include an ink covering a side surface of the display panel.

A color of the ink may be the same as a color of the light blocking layer.

The tiled display device may further include a resin disposed on the display panel within the bezel area and contacting each of the display panel, the light blocking layer, and the protective layer.

A refractive index of the resin may be equal to a refractive index of the protective layer.

A display device includes a first display panel module; and a second display panel module adjacent to the first display panel module. Each of the first and second display panel modules includes a display panel having a display area and a bezel area at least partially surrounding the display area; a light blocking layer disposed on the bezel area of the display panel; and a protective layer disposed on the light blocking layer. For each of the first and second display panel modules, the display panel, the light blocking layer, and the protective layer form a stepped shape.

The protective layer may include an anti-glare film or an anti-reflective film.

The stepped shape may be at least partially covered by an ink pattern.

The stepped shape may be a shape in which the light blocking layer, by only partially covering the display panel, forms a first step between an exposed portion of the display panel and the light blocking layer, and the protective layer, by only partially covering the light blocking layer, forms a second step between an exposed portion of the light blocking layer and the protection layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Illustrative, non-limiting embodiments of the present disclosure will be more clearly understood from the following detailed description in conjunction with the accompanying drawings.

Figure 1:
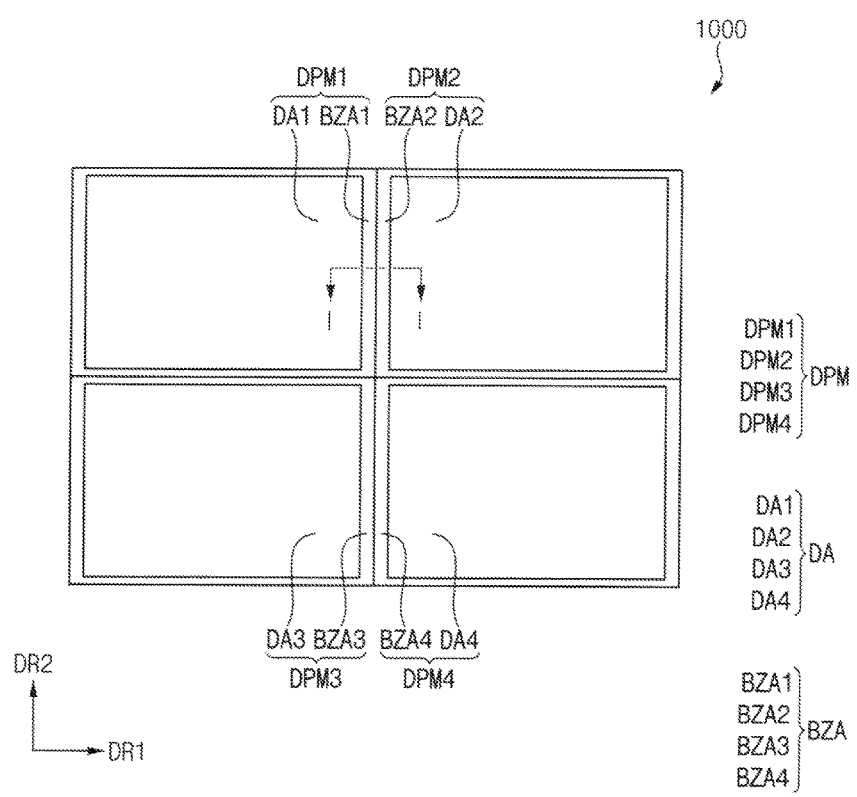
FIG. 1 is a plan view illustrating a tiled display device according to embodiments of the present disclosure.

FIG. 1 is a plan view illustrating a tiled display device 1000 according to embodiments of the present disclosure.

Referring to FIG. 1, the tiled display device 1000 may include a plurality of display panel modules DPM. The display panel modules DPM may include a first display panel module DPM1, a second display panel module DPM2, a third display panel module DPM3, and a fourth display panel module DPM4. However, the number of display panel modules DPM is exemplary and the present disclosure is not necessarily limited to any specific number of display panel modules. The display panel modules DPM may be arranged adjacent to each other on a plane defined by a first direction DR1 and a second direction DR2 that is perpendicular to the first direction DR1.

Each of the display panel modules DPM may include a display panel. The display panel may include a display area DA and a bezel area BZA at least partially surrounding the display area DA.

Each of the display panel modules DPM may have a rectangular outer shape. The sides of the display panel modules DPM are arranged adjacent to each other to define the tiled display device 1000 having a large rectangular area. The shape of each of the display panel modules DPM and the outline of the tiled display device 1000 are not necessarily limited thereto. Each of the display panel modules DPM and the tiled display device 1000 may have various shapes.

The tiled display device 1000 may include two display panel modules DPM1 and DPM2 arranged in the first direction DR1 and two display panel modules DPM3 and DPM4 arranged in the second direction DR2. The tiled display device 1000 may include the first to fourth display panel modules DPM1, DPM2, DPM3, and DPM4. However, this is an example, and the tiled display device 1000 may include various numbers of display panel modules DPM. For example, the tiled display device 1000 may include a plurality of display panel modules DPM arranged in a matrix form of "m" rows and "n" columns where m and n are positive integers. Also, the tiled display device 1000 may have a form in which any display panel module is excluded from among the display panel modules DPM arranged in the matrix form. For example, among the three display panel modules in the first direction DR1 and the two display panel modules in the second direction DR2, one display panel module at an arbitrary position is excluded, so that the tiled display device 1000 has a total of five display panel modules. Accordingly, the tiled display device 1000 might not have a rectangular outer shape.

The tiled display device 1000 may together display a single image by combining the plurality of display panel modules DPM. The tiled display device 1000 may display the large-area image without increasing an area of each of the display panel modules DPM.

Figure 2:
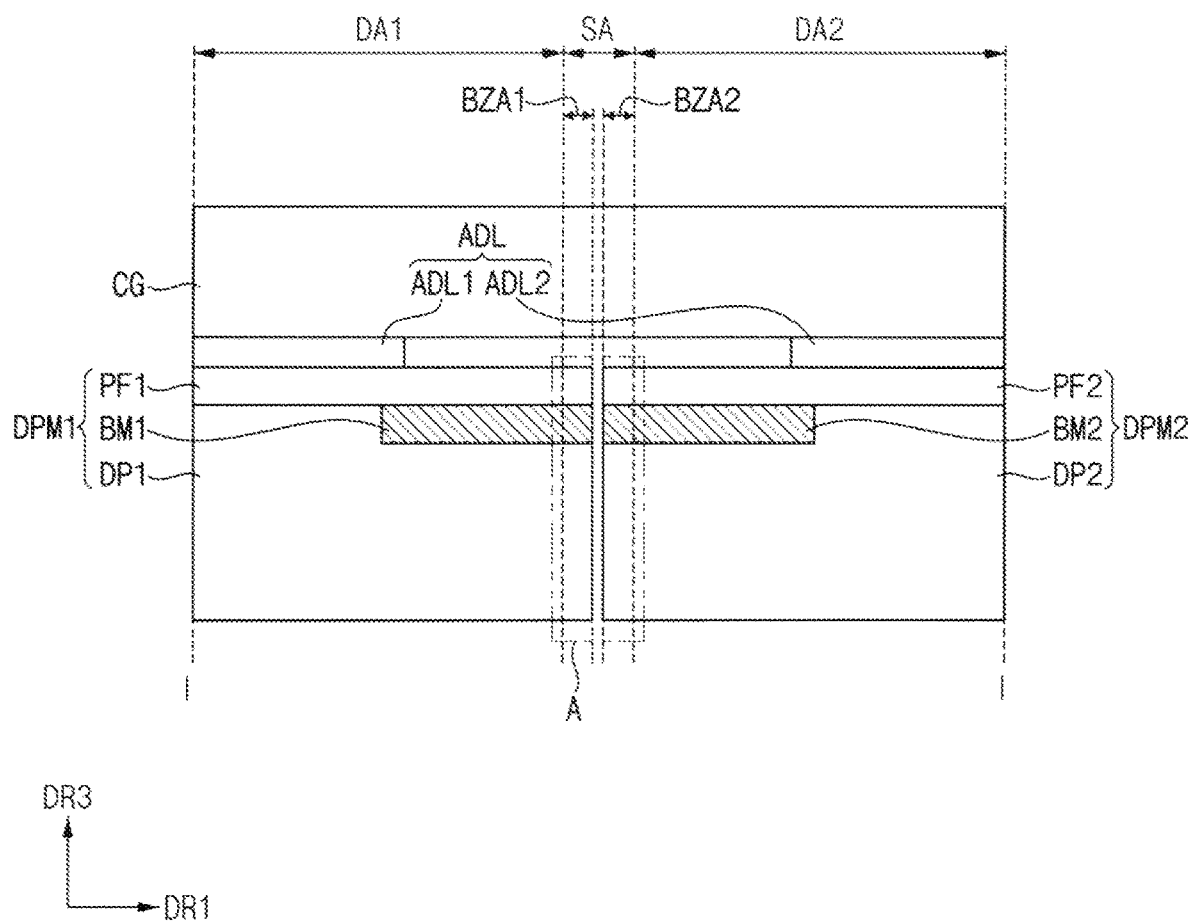
FIG. 2 is a cross-sectional view taken along line I-I' of FIG. 1.

FIG. 2 is a cross-sectional view taken along line I-I' of FIG. 1.

Referring to FIG. 2, each of the display panel modules DPM1 and DPM2 may include the display panel DP1 and DP2, a light blocking layer BM1 and BM2, and a protective layer PF1 and PF2. Each of the display panel modules DPM1 and DPM2 may be physically connected to each other by attaching a single cover glass CG over both display panels DP1 and DP2 through an adhesive layer ADL1 and ADL2 disposed on the protective layer PF1 and PF2. The display panel modules DPM1 and DPM2 may be electrically connected to each other by sharing other components such as an external device that supplies a driving signal to each of the display panels DP1 and DP2.

Since each of the display panel modules DPM1 and DPM2 includes the same component, the first display panel module DPM1 will be described in detail and it may be assumed that the second display module DPM2 has an at least similar arrangement.

The display panel DP1 may be a liquid crystal display panel, an organic light emitting display panel, an electrophoretic display panel, a plasma display panel, or the like. Hereinafter, the display panel DP1 will be described as an example of the organic light emitting display panel. However, the display panel DP1 is not necessarily limited to being the organic light emitting display panel.

The display panel DP1 may include the display area DA1 and the bezel area BZA1 at least partially surrounding the display area DA1.

The display area DA1 of the display panel DP1 may display an image. A circuit part, a light emitting part, an encapsulation part, and a color conversion part may be disposed in the display area DA1 of the display panel DP1. The circuit part disposed in the display area DA1 may include at least one thin film transistor and at least one capacitor. The circuit part may further include at least one insulating layer. The circuit part may be electrically connected to the light emitting part. The circuit part may provide various signals and voltages to the light emitting part.

The light emitting part disposed in the display area DA1 may be disposed on the circuit part. The light emitting part may include a light emitting device. The light emitting part may display the image through the light emitting device. The light emitting device may be an organic light emitting device. For example, the organic light emitting device may include a first electrode, a second electrode, and an organic light emitting layer disposed between the first electrode and the second electrode. The light emitting part may emit light by receiving the various signals and the voltages from the electrically connected circuit part.

The encapsulation part disposed in the display area DA1 may be disposed on the light emitting part. The encapsulation part may protect the light emitting part from external moisture and oxygen. The encapsulation part may include an inorganic layer and an organic layer that are alternately arranged. The encapsulation part may extend from the display area DA1 to the bezel area BZA1.

The color conversion part disposed in the display area DA1 may be disposed on the encapsulation part. The color conversion part may convert a wavelength of light generated from the light emitting part. The color conversion part may include a color filter that transmits light of a specific color. For example, the color conversion part may include a first color filter that transmits blue light, a second color filter that transmits red light, and a third color filter that transmits green light.

The color conversion part may further include a light blocking pattern disposed in the display area DA1. The light blocking pattern may be disposed adjacent to the first to third color filters in the display area DA1 to prevent color mixing. The light blocking pattern may extend from the display area DA1 to the bezel area BZA1.

Drivers (e.g., a gate driver and/or a data driver) may be disposed in the bezel area BZA1 of the display panel DP1. The bezel area BZA1 might not display an image. In the bezel area BZA1, the display panel modules DPM1 and DPM2 may be adjacent to each other.

The light blocking layer BM1 may be disposed on the display panel DP1. The light blocking layer BM1 may include substantially a same material as the light blocking pattern. For example, the light blocking layer BM1 may be a portion of the light blocking pattern. For example, the portion of the light blocking pattern may be referred to as the light blocking layer BM1.

The light blocking layer BM1 may extend from the display area DA1 of the display panel DP1 to the bezel area BZA1. The light blocking layer BM1 may include a black pigment. The light blocking layer BM1 may block light so that light is not emitted from the bezel area BZA1.

The protective layer PF1 may be disposed on the display panel DP1 and the light blocking layer BM1. The protective layer PF1 may include an optical film for achieving desired optical properties for satisfying a purpose of the display panel module DPM1.

In an embodiment of the present disclosure, the protective layer PF1 may include an anti-glare film or an anti-reflective film. The protective layer PF1 may be a polarizing film.

The display panels DP1 and DP2, the light blocking layers BM1 and BM2, and the protective layers PF1 and PF2 included in the display panel modules DPM1 and DPM2 may be spaced apart from each other by a predetermined distance. The bezel areas BZA1 and BZA2 of the display panel modules DPM1 and DPM2 adjacent to each other and an area where the display panels DP1 and DP2 are spaced apart from each other may be defined as a seam area SA.

Referring to FIGS. 1 and 2, the seam area SA may be an area that does not display the image. Accordingly, a user of the tiled display device 1000 viewing the large-area image may see disconnection of the large-area image at the seam area SA. The user of the tiled display device 1000 might not be able to view a single natural image, as the seam area SA may disjoint the image. Accordingly, a reduction in visibility of the seam area SA may be desired.

When the light blocking layer BM1 is disposed all the way to an end portion of the display panel DP1, a display quality of the display panel module DPM1 may be deteriorated. Accordingly, the light blocking layer BM1 might not be disposed to the end portion of the display panel DP1. A portion (e.g., the end portion) of the display panel DP1 on which the light blocking layer BM1 is not disposed may be exposed. However, the visibility of the seam area SA may increase due to a difference in contrast between the light blocking layer BM1 and the exposed display panel DP1.

Also, since the light blocking layer BM1 is not disposed all the way to the end portion of the display panel DP1, an air layer may be formed between the protective layer PF1 and the display panel DP1. Even if the air layer is finely formed, diffuse reflection of external light may occur in the air layer region. Accordingly, a difference in luminance of external light reflected from the air layer may occur. The visibility of the seam area SA may increase.

When an end of the protective layer PF1 is not cleanly cut, a protrusion may be formed at the end of the protective layer PF1. The diffuse reflection of external light may occur due to the protrusion. Accordingly, a difference in luminance of external light reflected by the protrusion may occur. The visibility of the seam area SA may increase.

For example, if the difference in contrast in the bezel area BZA1 is reduced, the air layer is removed, or the diffuse reflection of external light caused by the protrusion at the end of the protective layer PF1 is reduced, the visibility of the seam area SA may be reduced. Accordingly, the display quality of the tiled display device 1000 may be increased.

Figure 3:
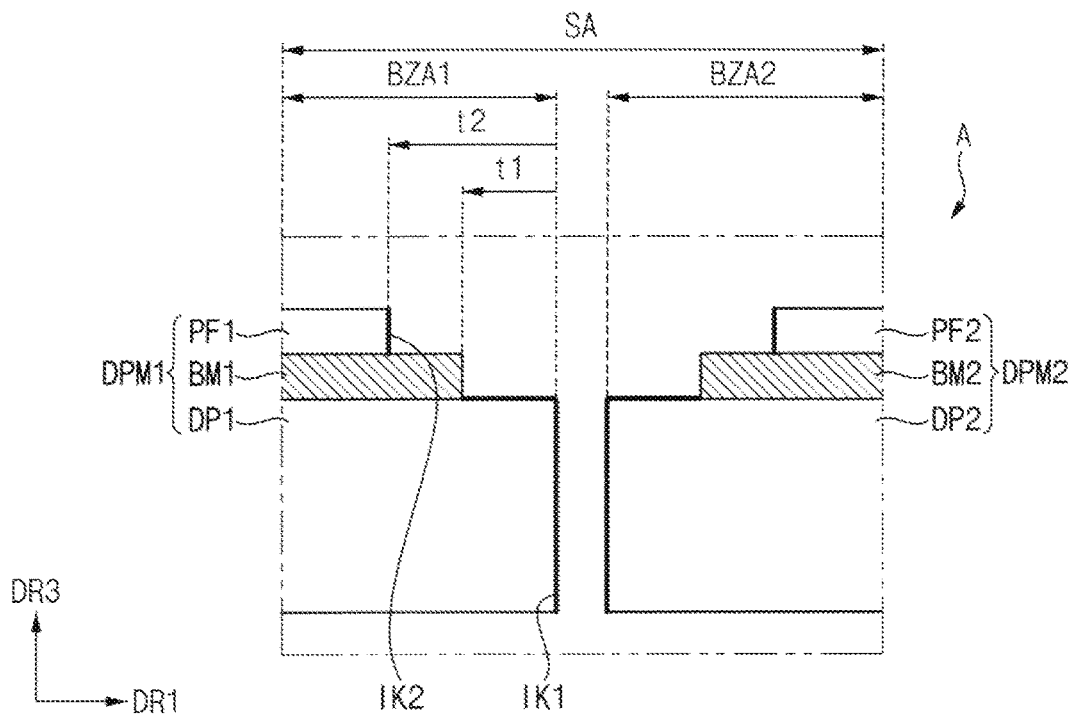
FIGS. 3 and 4 are cross-sectional views according to an embodiment of the present disclosure in which area A of FIG. 2 is enlarged.
Figure 4:
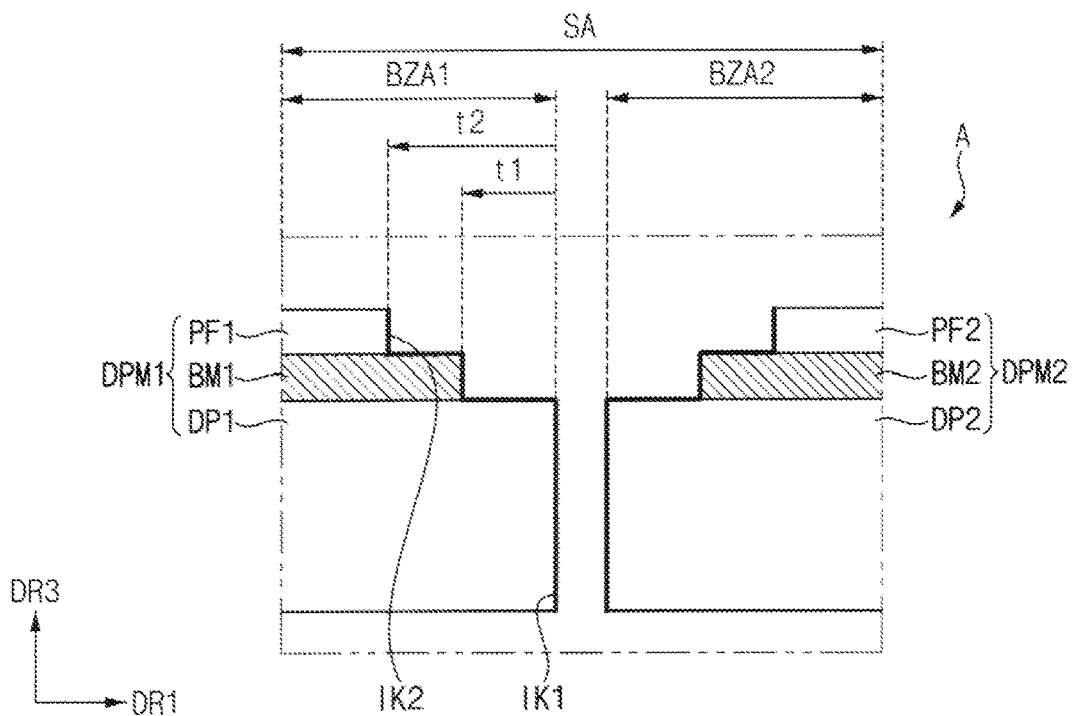

FIGS. 3 and 4 are cross-sectional views according to an embodiment in which area A of FIG. 2 is enlarged.

Referring to FIG. 3, the seam area SA of the tiled display device 1000 may be enlarged. The seam area SA may be partitioned a first bezel area BZA1 of the first display panel module DPM1, a second bezel area BZA2 of the second display panel module DPM2, and an area where adjacent the first and second display panel modules DPM1 and DPM2 are spaced apart from each other.

The light blocking layer BM1 might not be disposed to the end portion of the display panel DP1. The light blocking layer BM1 may be the portion of the light blocking pattern extending from the display area DA1 to the bezel area BZA1, and the light blocking layer BM1 may be disposed to a point spaced apart from an end of the display panel DP1 by a first distance t1. The light blocking layer BM1 may expose an upper surface of the display panel DP1 by the first distance t1.

The protective layer PF1 might not be disposed to the end portion of the display panel DP1. The protective layer PF1 may be disposed to a point spaced apart from the end of the display panel DP1 by a second distance t2. The second distance t2 may be greater than the first distance t1. In the bezel area BZA1, the second distance t2 from the end of the display panel DP1 to an end of the protective layer PF1 may be greater than the first distance t1 from the end of the display panel DP1 to an end of the light blocking layer BM1.

Since the second distance t2 is greater than the first distance t1, the air layer might not be formed between the protective layer PF1 and the display panel DP1. Accordingly, the visibility of the seam area SA may be reduced.

The tiled display device 1000 may further include a first ink IK1 covering the exposed upper surface of the display panel DP1 and a side surface of the display panel DP1 in the bezel area BZA1. A color of the first ink IK1 may be the same as a color of the light blocking layer BM1. The color of the first ink IK1 and the color of the light blocking layer BM1 may be black.

The difference in contrast between the light blocking layer BM1 and the exposed display panel DP1 may be reduced. Since the difference in contrast in the bezel area BZA1 is reduced, the visibility of the seam area SA may be reduced.

The tiled display device 1000 may further include a second ink IK2 covering a side surface of the protective layer PF1 in the bezel area BZA1. A color of the second ink IK2 may be the same as the color of the first ink IK1. The color of the first ink IK1, the color of the second ink IK2, and the color of the light blocking layer BM1 may be black. The second ink IK2 may include substantially the same material as the first ink IK1.

As the second ink IK2 covers the side surface of the protective layer PF1, the difference in contrast between the protective layer PF1, the light blocking layer BM1, and the exposed display panel DP1 may be reduced. Since the difference in contrast in the bezel area BZA1 is reduced, the visibility of the seam area SA may be reduced.

However, the color of the first ink IK1, the color of the second ink IK2, and the color of the light blocking layer BM1 are not necessarily limited to being black. The first ink IK1, the second ink IK2, and the light blocking layer BM1 may suffice as long as they have the same contrast and may have various colors.

The second ink IK2 covers the protrusion formed at the end of the protective layer PF1, so that the difference in luminance of external light due to the protrusion may be reduced. The difference in contrast in the bezel area BZA1 may be further reduced, and the difference in luminance of external light due to the protrusion may be reduced. Accordingly, the visibility of the seam area SA may be further reduced.

Referring to FIG. 4, in the bezel area BZA1, the first ink IK1 may contact the second ink IK2. The first ink IK1 may further cover an upper surface of the light blocking layer BM1 and a side surface of the light blocking layer BM1. However, the second ink IK2 may further cover the upper surface of the light blocking layer BM1 and the side surface of the light blocking layer BM1, and may contact the first ink IK1. For example, it may be sufficient if any one of the first ink IK1 and the second ink IK2 further covers the upper surface of the light blocking layer BM1 and the side surface of the light blocking layer BM1.

Since the substantially identical first ink IK1 and the second ink IK2 cover the seam area SA, the difference in contrast in the bezel area BZA1 may be reduced. Accordingly, the visibility of the seam area SA may be further reduced.

Figure 5:
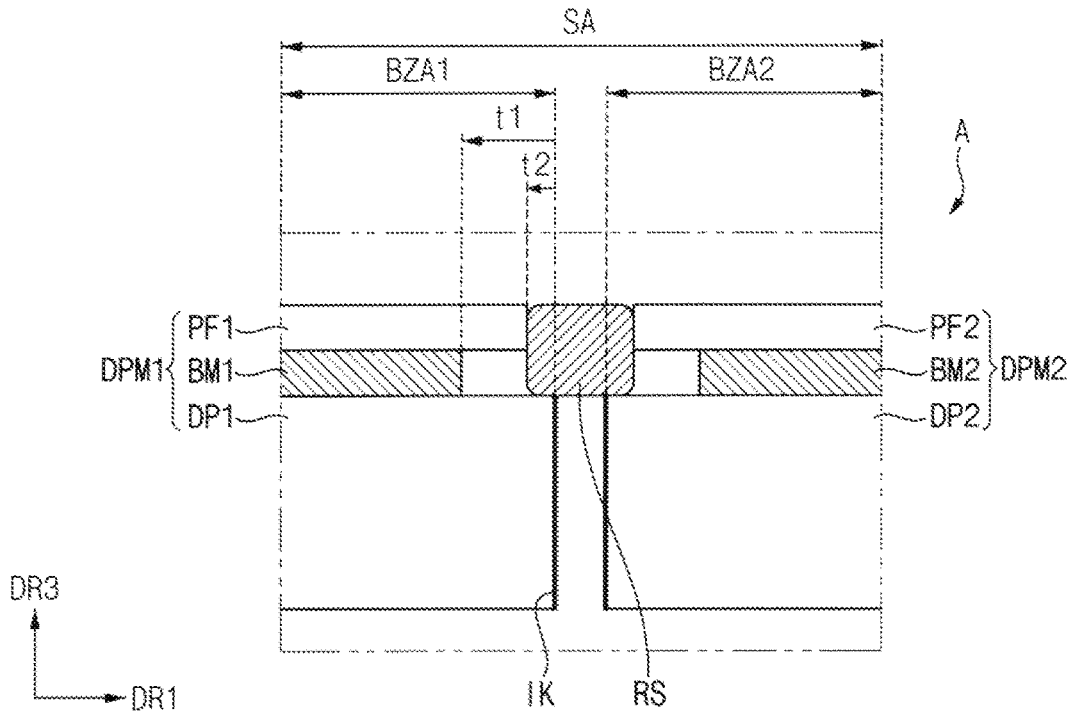
FIGS. 5 and 6 are cross-sectional views illustrating a tiled display device according to an embodiment of the present disclosure in which area A of FIG. 2 is enlarged.
Figure 6:
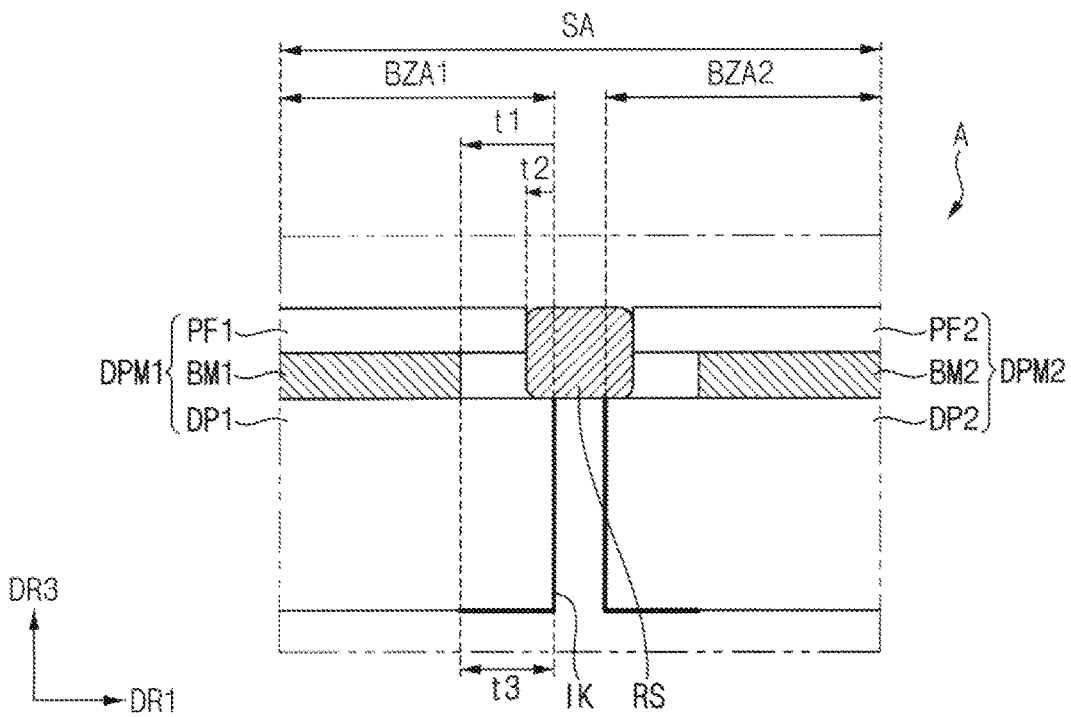

FIGS. 5 and 6 are cross-sectional views according to an embodiment of the present disclosure in which area A of FIG. 2 is enlarged.

Referring to FIG. 5, the seam area SA of the tiled display device 1000 may be enlarged. The seam area SA may be partitioned the first bezel area BZA1 of the first display panel module DPM1, the second bezel area BZA2 of the second display panel module DPM2, and the area where adjacent the first and second display panel modules DPM1 and DPM2 are spaced apart from each other.

The tiled display device 1000 may include a resin RS disposed in contact with the display panel DP1 in the bezel area BZA1. The resin RS may be entirely disposed in the first bezel area BZA1, the second bezel area BZA2, and the area where the first and second display panel modules DPM1 and DPM2 adjacent to each other are spaced apart from each other.

The resin RS may contact the protective layer PF1. A refractive index of the resin RS may be the same as that of the protective layer PF1. For example, the resin RS may contact the protective layers PF1 and PF2 of each of the first and second display panel modules DPM1 and DPM2. It is possible to reduce the diffuse reflection of external light due to the protrusion at the end of the protective layer PF1. Accordingly, the difference in luminance due to the diffuse reflection may be reduced. The visibility of the seam area SA may be reduced.

The tiled display device 1000 may further include an ink IK covering the side surface of the display panel DP1 in the bezel area BZA1. A color of the ink IK may be black.

As the ink IK covers the side surface of the display panel DP1, the difference in contrast between the light blocking layer BM1 and the exposed display panel DP1 may be reduced. Since the difference in contrast in the bezel area BZA1 is reduced, the visibility of the seam area SA may be reduced.

Referring to FIG. 6, in the bezel area BZA1, the ink IK may further cover a portion of a rear surface of the display panel DP1. The ink IK may cover the rear surface of the display panel DP1 from the end of the display panel DP1 to a third distance t3. The difference in contrast between the light blocking layer BM1 and the exposed display panel DP1 may be further reduced. Since the difference in contrast in the bezel area BZA1 is further reduced, the visibility of the seam area SA may be further reduced.

The ink IK may cover the rear surface of the display panel DP1 by the distance t1 or more from the end of the display panel DP1 to the end of the light blocking layer BM1. The third distance t3 may be greater than the first distance t1. The difference in contrast between the light blocking layer BM1 and the exposed display panel DP1 may be further reduced. Since the difference in contrast in the bezel area BZA1 is further reduced, the visibility of the seam area SA may be further reduced.

Figure 7:
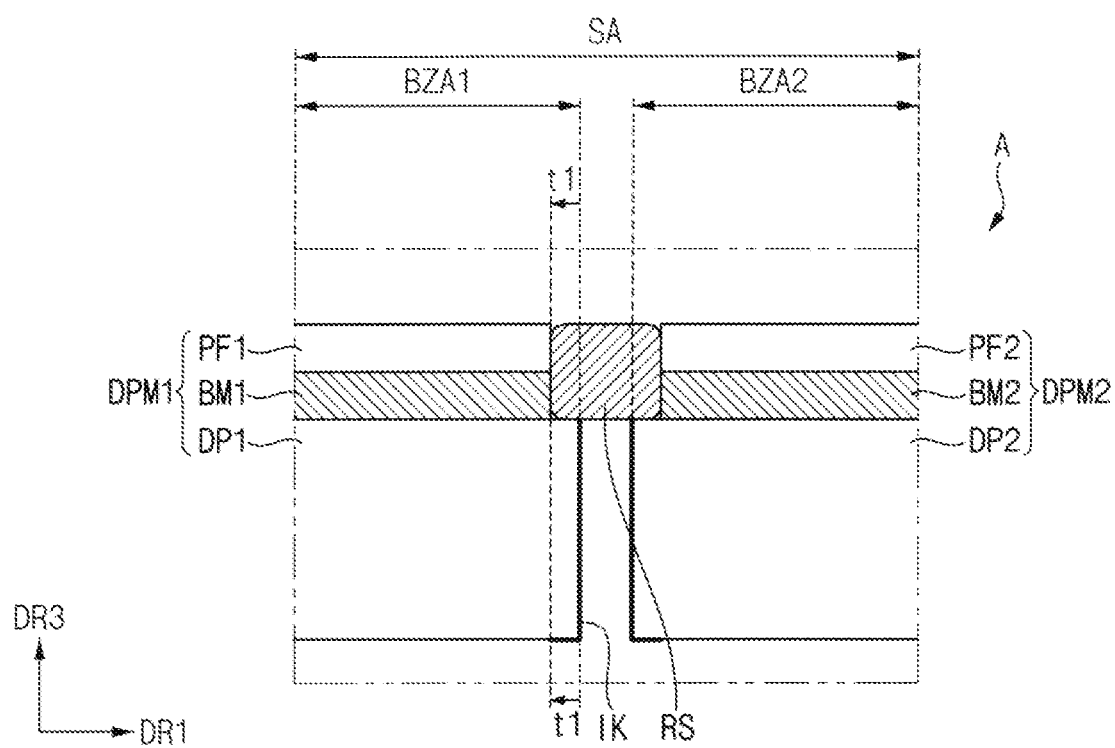
FIG. 7 is a cross-sectional view illustrating a tiled display device according to an embodiment of the present disclosure in which area A of FIG. 2 is enlarged.

FIG. 7 is a cross-sectional view according to an embodiment of the present disclosure in which area A of FIG. 2 is enlarged.

Referring to FIG. 7, the seam area SA of the tiled display device 1000 may be enlarged. The seam area SA may be partitioned by the first bezel area BZA1 of the first display panel module DPM1, the second bezel area BZA2 of the second display panel module DPM2, and the area where the adjacent first and second display panel modules DPM1 and DPM2 are spaced apart from each other.

The light blocking layer BM1 might not be disposed to the end portion of the display panel DP1. The light blocking layer BM1 may be disposed to the point spaced apart from the end of the display panel DP1 by the first distance t1. The light blocking layer BM1 may expose the upper surface of the display panel DP1 by the first distance t1.

The protective layer PF1 might not be disposed to the end portion of the display panel DP1. The protective layer PF1 may be disposed to the point spaced apart from the end of the display panel DP1 by the first distance t1.

In the bezel area BZA1, a distance from the end of the display panel DP1 to the end of the protective layer PF1 is substantially the same as the first distance t1 from the end of the display panel DP1 to the end of the light blocking layer BM1.

The air layer might not be formed between the protective layer PF1 and the display panel DP1. Accordingly, the visibility of the seam area SA may be reduced.

The tiled display device 1000 may further include the ink IK covering the side surface of the display panel DP1 in the bezel area BZA1. The color of the ink IK may be the same as the color of the light blocking layer BM1. The color of the first ink IK1 and the color of the light blocking layer BM1 may be black.

The ink IK may further cover a portion of the rear surface of the display panel DP1. The ink IK may cover the rear surface of the display panel DP1 by the distance t1 or more from the end of the display panel DP1. The difference in contrast between the light blocking layer BM1 and the exposed display panel DP1 may be further reduced. Since the difference in contrast in the bezel area BZA1 is further reduced, the visibility of the seam area SA may be further reduced.

The tiled display device 1000 may include the resin RS disposed in contact with the display panel DP1 in the bezel area BZA1. The resin RS may be entirely disposed in the first bezel area BZA1, the second bezel area BZA2, and the area where the first and second display panel modules DPM1 and DPM2 adjacent to each other are spaced apart from each other.

The resin RS may contact the protective layer PF1. The refractive index of the resin RS may be the same as that of the protective layer PF1. For example, the resin RS may contact the protective layers PF1 and PF2 of each of the first and second display panel modules DPM1 and DPM2. It is possible to reduce the diffuse reflection of external light due to the protrusion at the end of the protective layer PF1. Accordingly, the difference in luminance due to the diffuse reflection may be reduced. The visibility of the seam area SA may be reduced.

Although certain embodiments and implementations have been described herein, other embodiments and modifications will be apparent from the present description. Accordingly, the inventive concepts of the present disclosure are not necessarily limited to the described embodiments, but rather to the broader scope of the present disclosure and various obvious modifications and equivalent arrangements as would be apparent to a person of ordinary skill in the art.

What is claimed is:

1. A tiled display device, comprising:
    a plurality of display panel modules arranged adjacent to each other, wherein each of the plurality of display panel modules includes:
        a display panel including a display area and a bezel area at least partially surrounding the display area;
        a light blocking layer disposed on the display panel and extending from the display area to a portion of the bezel area; and
        a protective layer disposed on the light blocking layer,
    wherein in the bezel area, a distance from an end of the display panel to an end of the protective layer is greater than a distance from the end of the display panel to an end of the light blocking layer.

2. The tiled display device of claim 1, wherein the protective layer includes an anti-glare film or an anti-reflective film.

3. The tiled display device of claim 1, wherein a color of the light blocking layer is black.

4. The tiled display device of claim 1, wherein each of the plurality of display panel modules further includes:
    a first ink covering both an exposed upper surface of the display panel and a side surface of the display panel within the bezel area.

5. The tiled display device of claim 4, wherein each of the plurality of display panel modules further includes:
    a second ink covering a side surface of the protective layer within the bezel area.

6. The tiled display device of claim 5, wherein the first ink contacts the second ink within the bezel area, and
    wherein the first ink further covers an upper surface of the light blocking layer and a side surface of the light blocking layer.

7. The tiled display device of claim 5, wherein a color of the first ink is the same as a color of the second ink.

8. The tiled display device of claim 5, wherein a color of the first ink and a color of the second ink are black.

9. A display device, comprising:
    a first display panel module; and
    a second display panel module adjacent to the first display panel module,
    wherein each of the first and second display panel modules includes:
        a display panel having a display area and a bezel area at least partially surrounding the display area;
        a light blocking layer disposed on the bezel area of the display panel; and
        a protective layer disposed on the light blocking layer,
    wherein, for each of the first and second display panel modules, the display panel, the light blocking layer, and the protective layer form a stepped shape.

10. The display device of claim 9, wherein the protective layer includes an anti-glare film or an anti-reflective film.

11. The display device of claim 9, wherein the stepped shape is at least partially covered by an ink pattern.

* * * * *